United States Patent
Seki

[11] Patent Number: 5,968,441
[45] Date of Patent: Oct. 19, 1999

[54] LASER PROCESSING METHOD

[75] Inventor: Yuko Seki, Tokyo, Japan

[73] Assignee: Nec Corporation, Tokyo, Japan

[21] Appl. No.: 09/174,102

[22] Filed: Oct. 16, 1998

[30] Foreign Application Priority Data

Oct. 21, 1997 [JP] Japan .................................. 9-288465
Apr. 10, 1998 [JP] Japan ................................ 10-099213

[51] Int. Cl.$^6$ ................................................ B23K 26/00
[52] U.S. Cl. ........................................ 264/400; 264/1.37
[58] Field of Search ................... 264/400, 1.37; 29/25.01

[56] References Cited

U.S. PATENT DOCUMENTS

| 5,424,244 | 6/1995 | Zhang et al. | 437/173 |
| 5,495,548 | 2/1996 | Bilodeau et al. | 385/123 |
| 5,843,363 | 12/1998 | Mitwalsky et al. | 264/400 |

FOREIGN PATENT DOCUMENTS

| 1-296623 | 11/1989 | Japan . |
| 2-278865 | 11/1990 | Japan . |
| 3-71991 | 3/1991 | Japan . |
| 3-154385 | 7/1991 | Japan . |
| 4-182093 | 6/1992 | Japan . |
| 4-305392 | 10/1992 | Japan . |
| 5-104278 | 4/1993 | Japan . |
| 8-85819 | 4/1996 | Japan . |

OTHER PUBLICATIONS

J. Zhang et al., "Dual–Beam Ablation of Fused Quartz Using 266 nm and VUV Lasers With Different Delay–Times", Applied Plysics A 64, 477–481, (1997).

*Primary Examiner*—Jan H. Silbaugh
*Assistant Examiner*—Stefan Staicovici
*Attorney, Agent, or Firm*—Whitham, Curtis & Whitham

[57] ABSTRACT

A laser processing method for ablating a transparent material is disclosed. A laser beam absorption layer is formed in a desired ablation portion beforehand by the implantation of an impurity or the increase of a defect density. The absorption layer obviates damage ascribable to thermal strain and, when use is made of a VUV (Vacuum Ultra Violet) beam, damage to portions other than an irradiated portion. This allows a simple apparatus to implement the ablation of a transparent film.

8 Claims, 4 Drawing Sheets

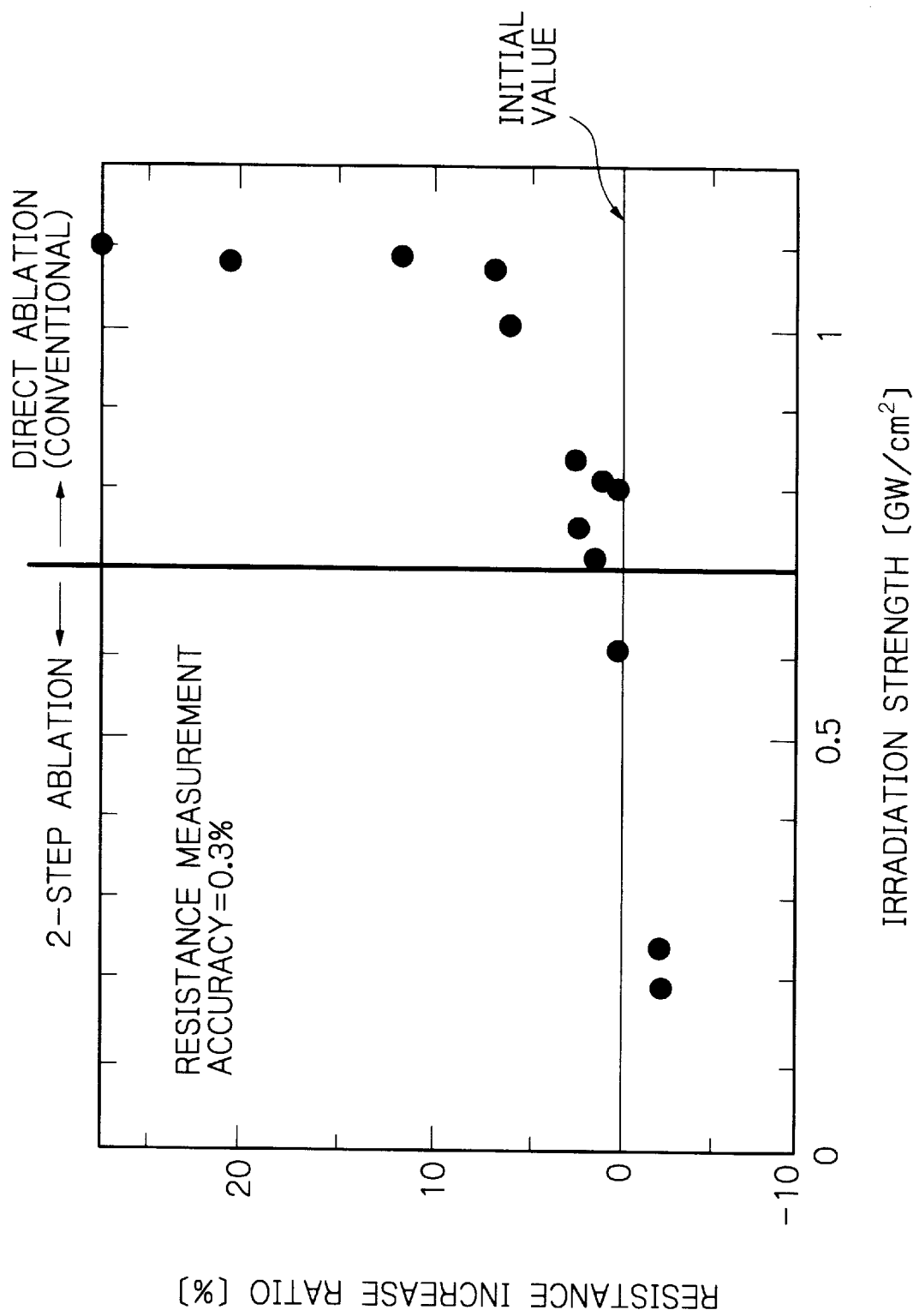

LASER PROCESSING METHOD

BACKGROUND OF THE INVENTION

The present invention relates to a laser processing method for ablating a transparent material.

A wiring correcting device using a laser has contributed to the reduction of an LSI development procedure a great deal. To connect two wirings below an inter layer insulation film, the device forms via holes in the inter layer insulation film above the wirings by laser ablation and then connects the wirings by direct writing using a laser.

So long as the interlayer insulation film is formed of silicon nitride (SiN) or similar substance capable of absorbing a laser beam, a laser beam can implement desirable ablation with heat and damages an under wiring little. However, silicon dioxide (SiO2) or PSu (Phospho Silicate Glass) often used as an interlayer insulation film or a protection film is transparent for visible rays and therefore heated little itself even when irradiated by a laser beam lying in the visible range. In this case, ablation relies on a transmitted beam heating, underlying interconnections. However, this kind of processing is explosive and noticeably damages the under wiring.

To reduce the above damage to underlying interconnections ascribable to ablation, Japanese Patent Laid-Open Publication No. 1-296623 teaches a method which applies a thermal stress to a portion to be ablated by laser irradiation beforehand. Also, a method which causes ablation to occur with a UV (Ultra Violet) beam or a visible beam while exciting the atoms and molecules of a transparent material or photochemically decomposing a transparent material with a VUV (Vacuum UV) beam is discussed in Applied Physics, A64, pp. 477–481, 1997.

However, the problem with the method taught in the above Laid-Open Publication No. 1-296623 is that the influence of thermal strain and therefore damage is not avoidable although the processing threshold value can be reduced. The VUV scheme disclosed in Applied Physics has a problem that two beam sources, one for VUV and the other for UV, are essential and complicate the construction of an apparatus while increasing the size and cost of the apparatus. Moreover, optics capable of accurately patterning a VUV beam is not available at the present stage of development, so that the VUV irradiation area extends to portions not needing processing and aggravates damage.

Technologies relating to the present invention are also disclosed in, e.g., Japanese Patent Laid-Open Publication Nos. 2-278865, 3-71991, 3-154385, 4-182093, 4-305392, 5-104278, and 8-85819.

SUMMARY OF THE INVENTION

It is therefore an object of the present invention to provide a laser processing method capable of ablating an expected portion with a simple apparatus without damaging the other portions or an under wiring.

A laser processing method for ablating a transparent material with a laser of the present invention has the steps of irradiating a laser beam for forming a laser beam absorption layer in a portion of the transparent material to be ablated, and irradiating a laser beam for ablating the laser beam absorption layer.

BRIEF DESCRIPTION OF THE DRAWINGS

The above and other objects, features and advantages of the present invention will become apparent from the following detailed description taken with the accompanying drawings in which:

FIG. 4 is a graph showing a relation between the irradiation power and the variation of resistance also particular to the embodiment of FIGS. 2A and 2B.

DESCRIPTION OF THE PREFERRED EMBODIMENTS

Figure 1A:
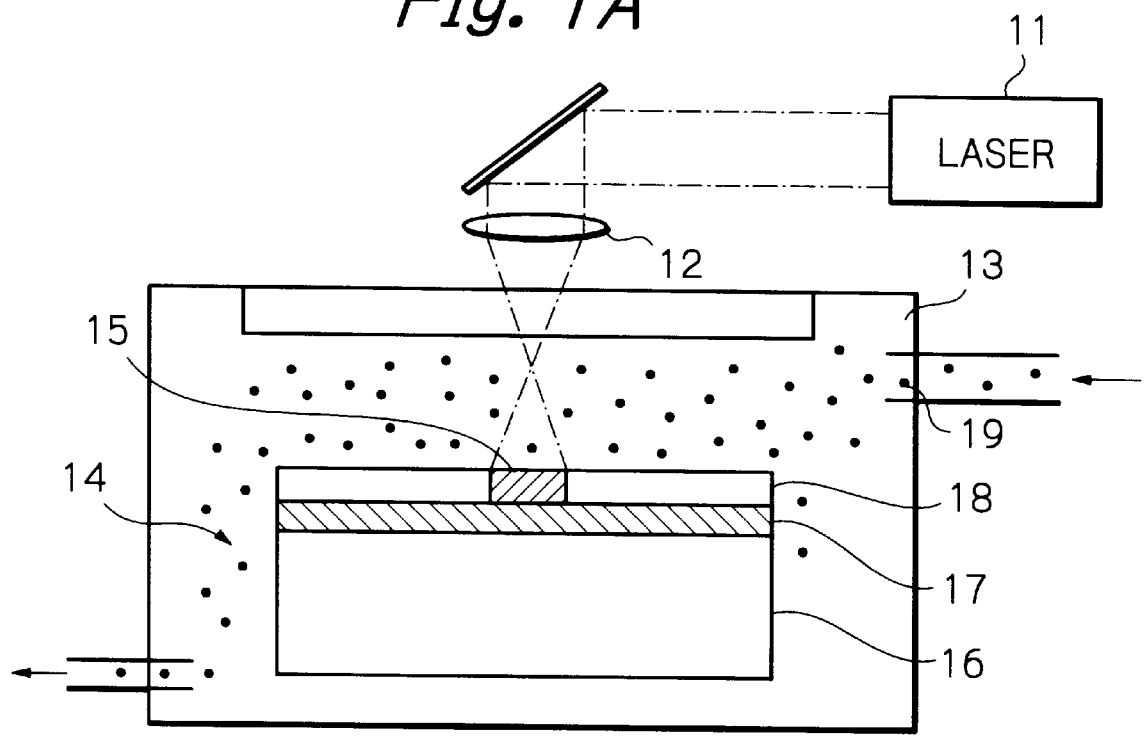
FIGS. 1A and 1B are sections respectively showing a first and a second step included in a laser processing method embodying the present invention.
Figure 1B:
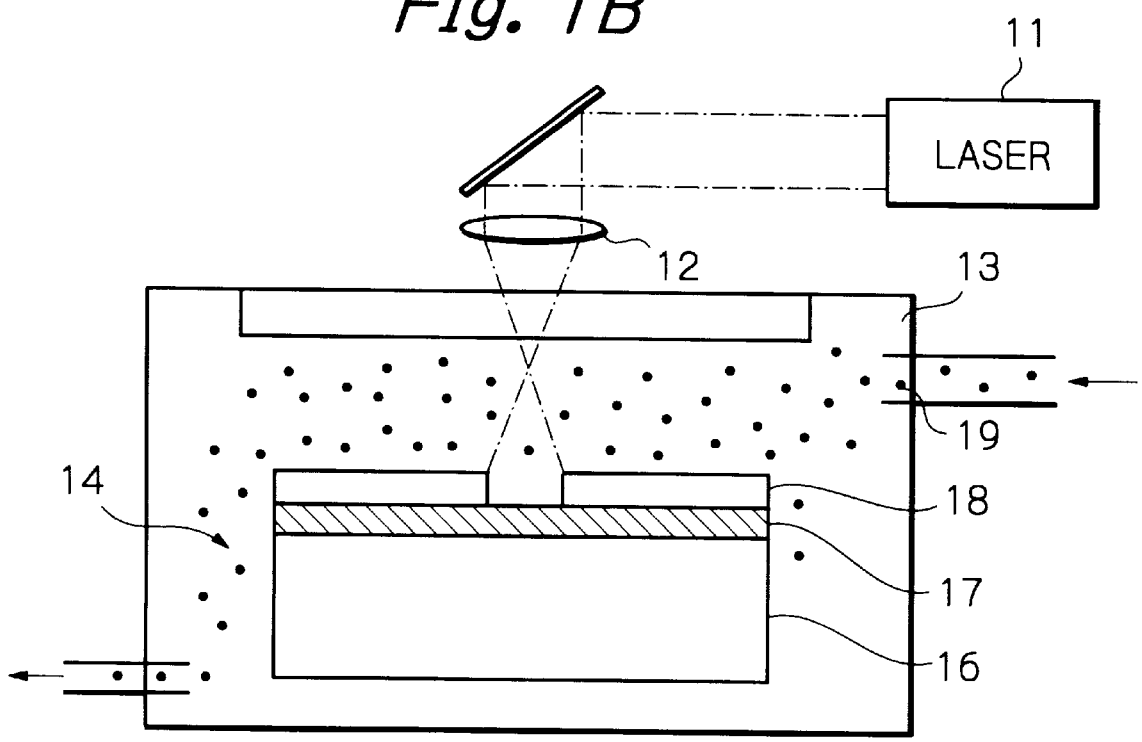

Referring to FIGS. 1A and 1B, a laser processing method embodying the present invention and used to form a via hole by ablation is shown. FIGS. 1A and 1B show a first and a second laser irradiation step, respectively. There are shown in FIGS. 1A and 1B an ArF laser 11 capable of emitting a 193 nm UV beam, a lens 12, a processing chamber 13, a sample 14, an absorption layer 15, silicon (Si) 16, an aluminum (Al) wiring layer 17, an $SiO_2$ film 18, and a diborane ($B_2H_6$)

As shown in FIG. 1A, the sample 14 was disposed in the processing chamber 13 filled with a $B_2H_6$ atmosphere 19. A 193 nm UV beam was emitted from the laser 11 by several tens of pulses in order to irradiate the surface of the sample 14 via the lens 12 with power of 0.5 $GW/cm^2$. The beam heated the surface of the Al wiring layer 17 of the sample 14 with the result that the $SiO_2$ film 18 overlying the wiring layer 17 approached its melting point due to heat conduction from Al. The temperature of the $SiO_2$ film may increase above its melting point, but stays below the ablation temperature. Consequently, boron in the atmospheric gas was implanted in the $SiO_2$ film 18, forming the absorption layer 15 in the film 18.

Subsequently, as shown in FIG. 1B, a beam having power of 0.7 $GW/cm^2$ lower than the ordinary threshold of 0.8 $GW/cm^2$ was irradiated onto the absorption layer 15 via the same optics. A single pulse was successful to ablate the absorption layer 15, thereby forming a desired via hole. The resistance of the Al wiring layer 17 changed little even after the above processing. This indicates that a minimum of damage occurred in the sample 14.

While the above embodiment is effectively applicable to the fabrication of a photo mask, it is sometimes adversely effected by doping when applied to, e.g., the insulation film of an LSI (Large Scale Integrated circuit). An alternative embodiment of the present invention not needing doping will be described hereinafter with reference to FIGS. 2A and 2B. The alternative embodiment also forms a via hole by ablation.

Figure 2A:
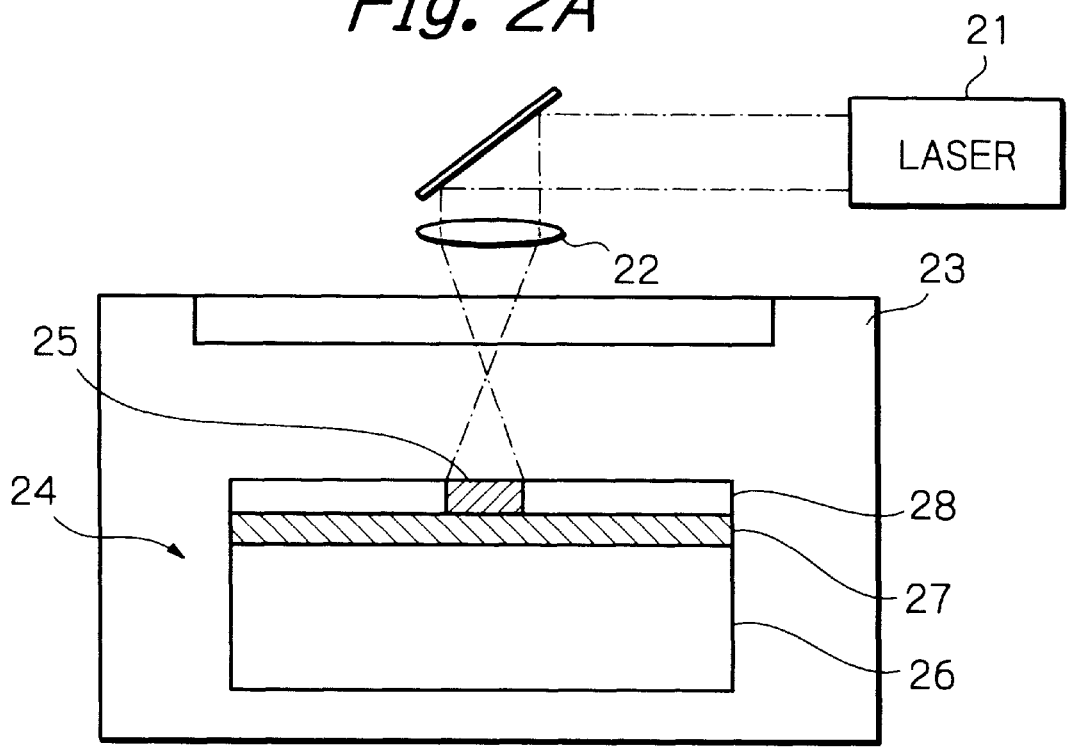
FIGS. 2A and 2B are sections respectively showing a first and a second step included in an alternative embodiment of the present invention.
Figure 2B:
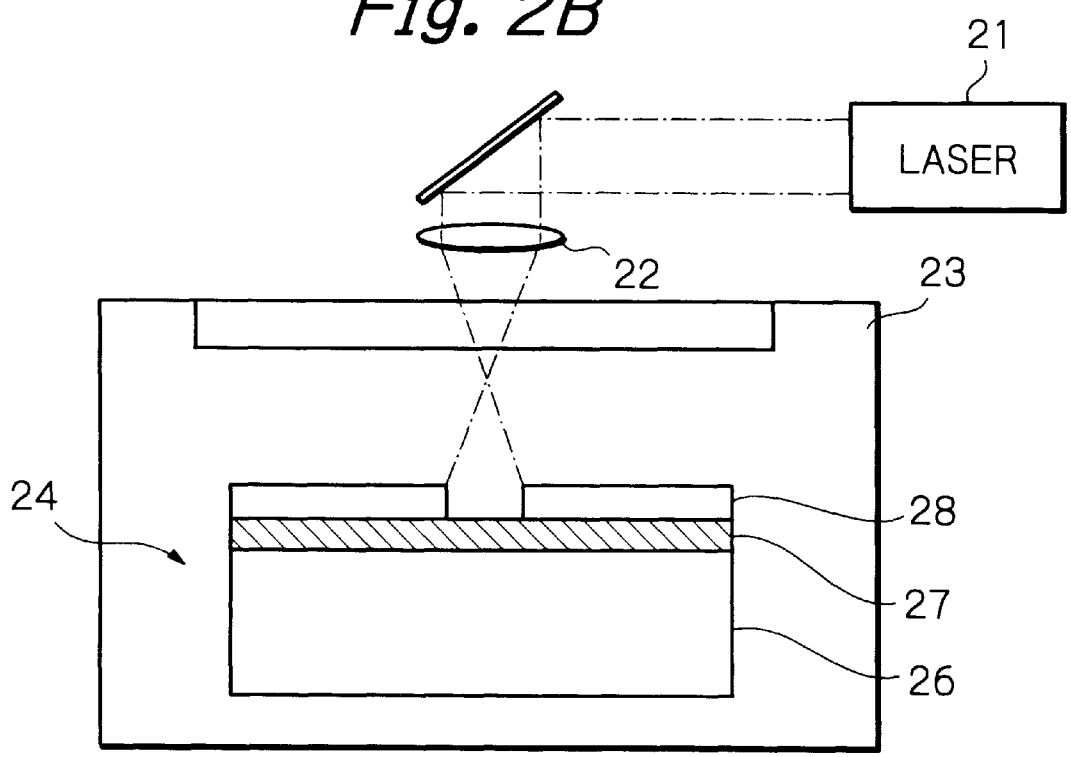

FIGS. 2A and 2B show a first and a second laser irradiation step, respectively. There are shown in FIGS. 2A and 2B an ArF laser 21 capable of emitting a 193 nm UV beam, a lens 22, a processing chamber 23, a sample 24 disposed in the chamber 23, an absorption layer 25, Si 26, an Al wiring layer 27, and an $SiO_2$ film.

As shown in FIG. 2A, a 193 nm UV beam was emitted from the laser 21 by several tens of pulses in order to irradiate the surface of the sample 24 via the lens 12 with a strength of 0.1 $GW/cm^2$. The beam increased the defect density of the $SiO_2$ film 28 and thereby formed the absorption layer 25. As a result, the absorption coefficient of the absorption layer 25 increased.

Subsequently, as shown in FIG. 2B, a beam having power of 0.3 $GW/cm^2$ lower than the ordinary threshold of 0.8 $GW/cm^2$ was irradiated onto the absorption layer 25 via the same optics. A single pulse was successful to ablate the absorption layer 25. When the number of pulses in the step of FIG. 2A was increased to 100 or above, power of 0.2 $GW/cm^2$ sufficed for ablation.

Figure 3:
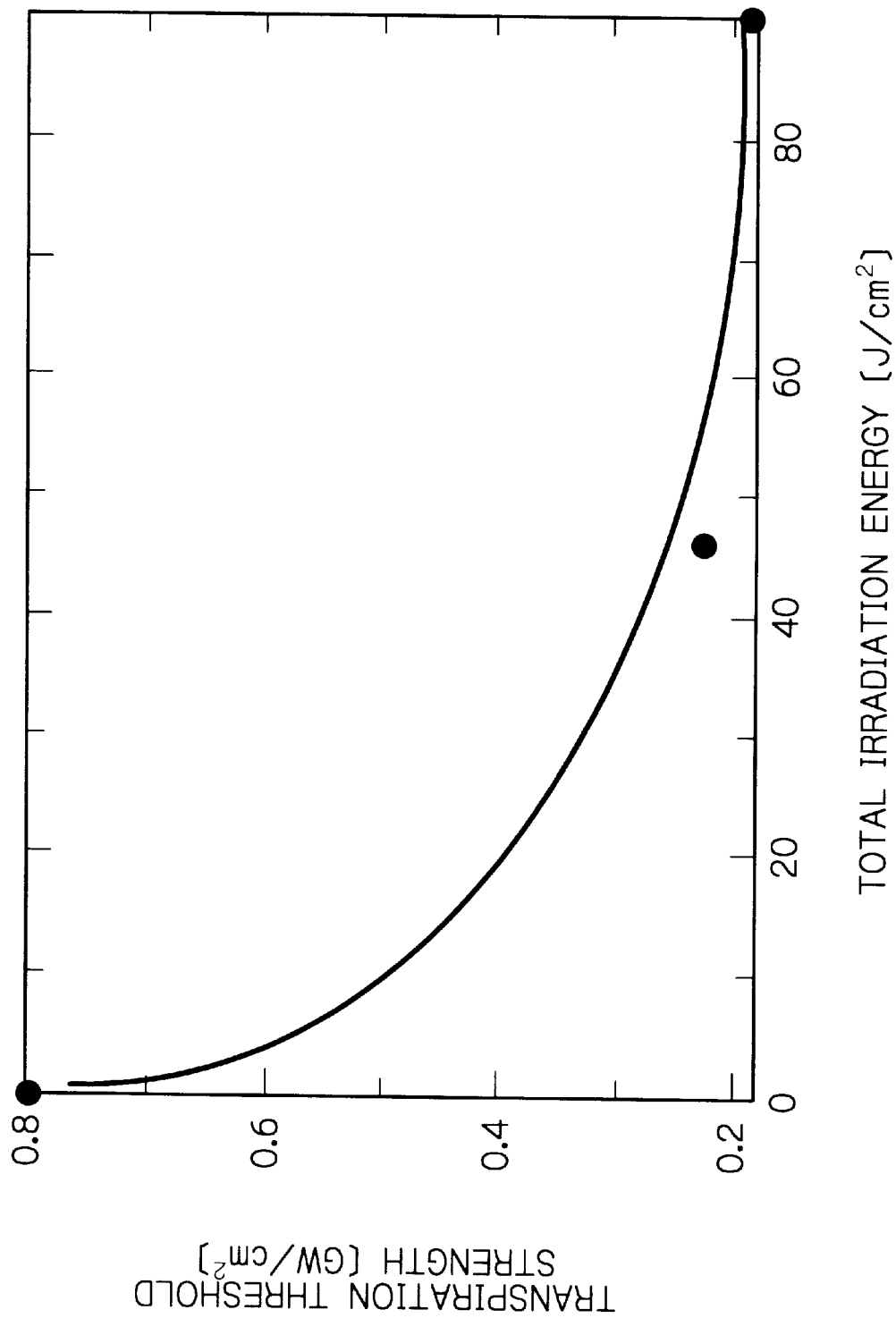
FIG. 3 is a graph showing a relation between the total irradiation energy and the threshold power necessary for ablation particular to the embodiment of FIGS. 2A and 2B.

FIG. 3 shows a relation between the total irradiation energy used to form the absorption layer 25 in the above two-step procedure and the threshold power necessary for ablation. The total irradiation energy refers to (energy density for a single pulse×number of pulses). As FIG. 3 indicates, the threshold power decreases as the configuration of the absorption layer 25 becomes more complete.

The resistance of the Al wiring layer 27 changed little even after the above processing. This indicates that a minimum of damage occurred in the sample 24. FIG. 4 plots a relation between the irradiation strength during ablation and the variation of resistance. As shown, there exist a range in which ablation occurs by a single irradiation (direct ablation range) and a range in which it occurs after the two-step processing (two-step ablation); the border between the two ranges is 0.7 $GW/cm^2$. In samples subjected to the two-step processing, resistance does not increase; rather, it is apt to decrease from the initial value at 0.23 $GW/cm^2$ and 0.18 $GW/cm^2$. Such a decrease presumably stems from the improvement in wiring resistance caused by an annealing effect achievable with the laser beam. This does not matter at all in practice.

While the illustrative embodiments have concentrated on $SiO_2$, the present invention is capable of ablating even a PSG film in exactly the same manner.

The ArF laser used in the above embodiments may, of course, be replaced with any other suitable laser. For example, use may be made of KrF laser although it increases the threshold value by 10% to 20%. Further, diborane playing the role of an impurity in the illustrative embodiments may be replaced with phosphine ($PH_3$) or similar gas so long as it is an impurity matching with the crux of the present invention.

In summary, in accordance with the present invention, an absorption layer is formed in a desired ablation portion beforehand by the implantation of an impurity or the increase of a defect density. The absorption layer obviates damage ascribable to thermal strain and, when use is made of a VUV beam, damage to portions other than an irradiated portion. This allows a simple apparatus to implement the ablation of a transparent film.

Further, in accordance with the present invention, the absorption coefficient of a transparent thin layer is increased by an impurity implanted in the film or the irradiation of a UV beam in order to lower threshold irradiation power necessary for processing. Therefore, portions other than a portion to be processed and an under wiring are free from thermal strain. Moreover, a single laser can be shared by the formation of the absorption layer and the actual ablation, simplifying the construction. In addition, a beam whose wavelength is around 200 nm, as distinguished from a VUV beam, can be sufficiently converged and patterned by an optical part implemented by synthetic quartz. This prevents a UV beam from irradiating unexpected portions and inducing damage over a broad range.

Various modifications will become possible for those skilled in the art after receiving the teachings of the present disclosure without departing from the scope thereof.

What is claimed is:

1. A laser processing method for ablating a transparent material layer of a sample with a laser comprising the steps of:

irradiating the layer with a first laser beam for forming a laser beam absorption layer in a portion of the transparent material to be ablated, wherein said first laser beam has a power below an ablating point of the transparent material, but above a melting point of the transparent material; and then, irradiating the layer with a second laser beam for ablating the portion of the transparent material forming said laser beam absorption layer without damaging other portions of the sample.

2. A method as claimed in claim 1, wherein said first laser beam for forming said laser beam absorption layer causes an impurity to be implanted in the portion to be ablated.

3. A method as claimed in claim 2, wherein said first laser beam for forming said laser beam absorption layer is irradiated in a gaseous impurity atmosphere.

4. A method as claimed in claim 3, wherein said first beam comprises an ultraviolet laser beam.

5. A method as claimed in claim 3, wherein the gaseous impurity comprises diborane ($B_2H_6$).

6. A method as claimed in claim 3, where in the gaseous impurity comprises phosphine ($PH_3$).

7. A method as claimed in claim 1, wherein said first laser beam for forming said laser beam absorption layer increases a defect density of the portion to be ablated.

8. A method as claimed in claim 1, wherein said first laser beam and said second laser beam emanate from the same laser.

* * * * *